(12) United States Patent
Izuru et al.

(10) Patent No.: US 6,462,574 B1
(45) Date of Patent: Oct. 8, 2002

(54) BURN-IN SYSTEM, BURN-IN CONTROL TECHNIQUE, AND SEMICONDUCTOR DEVICE PRODUCTION METHOD USING SAID SYSTEM AND TECHNIQUE

(75) Inventors: Hitoshi Izuru; Hiroyuki Yoshioka; Toshiaki Tominaga, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/506,075

(22) Filed: Feb. 16, 2000

(30) Foreign Application Priority Data

Jul. 14, 1999 (JP) .......................... 11-200213

(51) Int. Cl.$^7$ ........................ G01R 31/02; G01R 31/26
(52) U.S. Cl. ...................................... 324/760; 324/765
(58) Field of Search ................................ 324/527, 763, 324/764, 765, 760, 158.1; 371/22

(56) References Cited

U.S. PATENT DOCUMENTS 5,204,618 A * 4/1993 Matsuoka ............... 324/158 R

FOREIGN PATENT DOCUMENTS

| JP | 6-97257 | 4/1994 |
| JP | 7-5226 | 1/1995 |

* cited by examiner

*Primary Examiner*—Michael Sherry
*Assistant Examiner*—Paresh Patel
(74) *Attorney, Agent, or Firm*—Armstrong, Westerman & Hattori, LLP

(57) ABSTRACT

A burn-in system, a burn-in control technique, and a semiconductor device production method utilizing the burn-in control technique are provided. The burn-in system of the present invention comprises a plurality of burn-in devices and an independent counter terminal. Each of the burn-in devices calculates a parameter indicating the number of mounted semiconductor devices, and generates measurement data indicating quality of the individual semiconductor devices collectively subjected to a burn-in test. The counter terminal adds up the parameters and measurement data sent from the burn-in devices. The counter terminal then calculates a failure rate based on the total parameter and the measurement data, and stops the burn-in test of each of the burn-in devices when the failure rate reaches a predetermined reference value.

5 Claims, 5 Drawing Sheets

BURN-IN SYSTEM, BURN-IN CONTROL TECHNIQUE, AND SEMICONDUCTOR DEVICE PRODUCTION METHOD USING SAID SYSTEM AND TECHNIQUE

BACKGROUND OF THE INVENTION

1. Field of the Invention

The present invention generally relates to burn-in systems and burn-in control techniques, and more particularly, to a burn-in system and a burn-in control technique by which a monitored burn-in test can be performed on a large number of semiconductor devices. The present invention also relates to a semiconductor device production method utilizing the burn-in control technique.

A method of producing semiconductor devices generally comprises: a wafer processing step of forming circuits on a wafer; a dicing step of dicing the processed wafer into individual semiconductor chips; a chip mounting step of die-bonding and wire-bonding the semiconductor chips to a lead frame; and a resin encapsulating step of encapsulating the mounted semiconductor chips with resin. Reliability tests are then performed on the semiconductor devices. One of the known reliability tests is a burn-in test. In the burn-in test, the semiconductor devices are heated at a predetermined high temperature for a predetermined period of time so as to facilitate initial failures to identify semiconductor devices with a possibility of failure in an early stage.

A burn-in system is used to perform such a burn-in test. There are two types of burn-in systems. One of them has a monitor function to check the operating states of the semiconductor devices during the burn-in test, and the other has no monitor function. A burn-in system having the monitor function is called a monitored burn-in system, and one having no monitor function is called a dynamic burn-in system.

The monitor function is essential for the determination of the quality of semiconductor devices. Having the monitor function, the monitored burn-in system can readily check whether semiconductor devices are in a proper energized state and are supplied with proper input signals. The monitored burn-in system is becoming more common as a means to improve the reliability of the burn-in test.

2. Description of the Related Art

Figure 1:
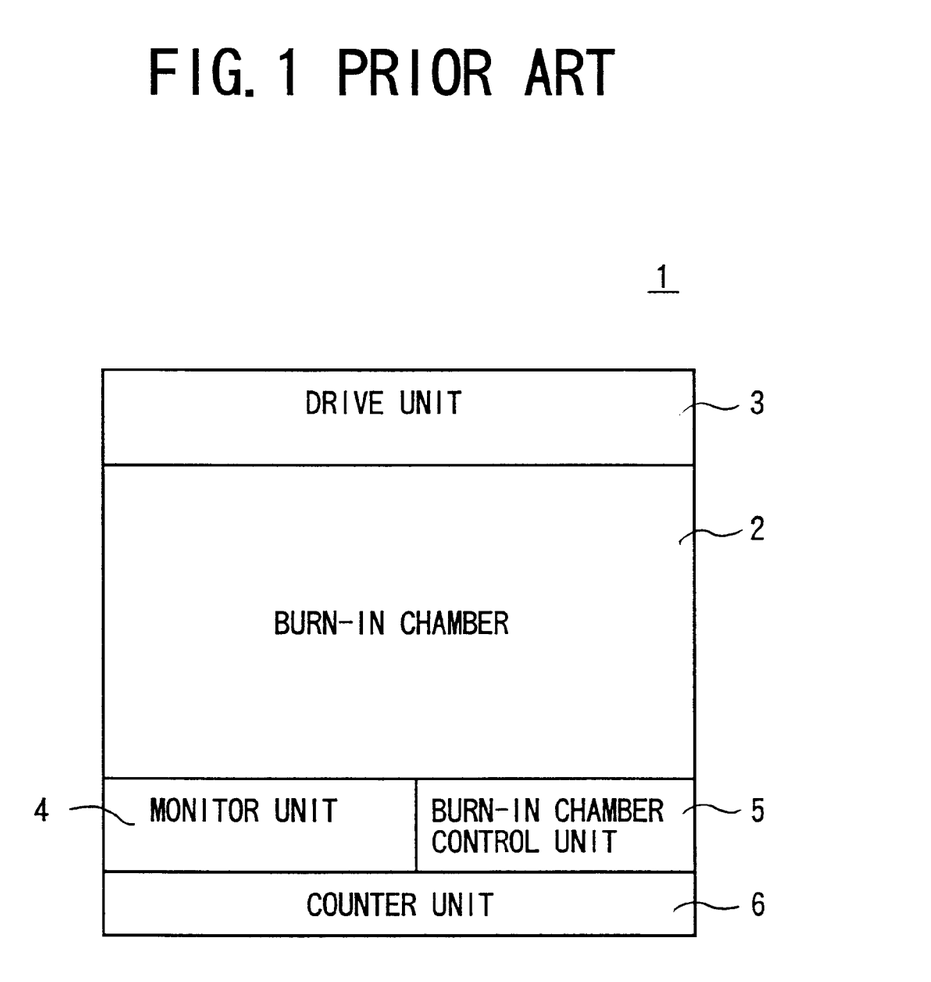
FIG. 1 shows the structure of a burn-in system of the prior art.

FIG. 1 shows the structure of a conventional burn-in system 1. The burn-in system 1 comprises a burn-in chamber 2, a drive unit 3, a monitor unit 4, a burn-in chamber control unit 5, and a counter unit 6.

The burn-in chamber 2 adjusts its inner temperature to a desired temperature, and accommodates burn-in boards to which semiconductor devices are attached. A burn-in test is carried out on the mounted semiconductor devices in the burn-in chamber 2.

The drive unit 3 is connected to each of the burn-in boards accommodated in the burn-in chamber 2, and supplies operating current and operating signals to each of the semiconductor devices via the respective burn-in boards. The monitor unit 4 monitors the operations of the semiconductor devices driven by the drive unit 3, and supplies the monitor results to the counter unit 6.

The burn-in chamber control unit 5 controls the inner temperature of the burn-in chamber 2 to a desired temperature, and also stops the burn-in test upon receipt of a burn-in termination instruction issued from the counter unit 6. The counter unit 6 calculates a failure rate based on quality data of each semiconductor device supplied from the monitor unit 4 and the number of semiconductor devices accommodated in the burn-in chamber 2. When the failure rate becomes lower than a predetermined reference value, the counter unit 6 issues the burn-in termination instruction to the burn-in chamber control unit 5, thereby stopping the burn-in test. Here, a parameter is the number of semiconductor devices which work properly during a simple preliminary test among the semiconductor devices mounted in the burn-in chamber 2.

Figure 2:
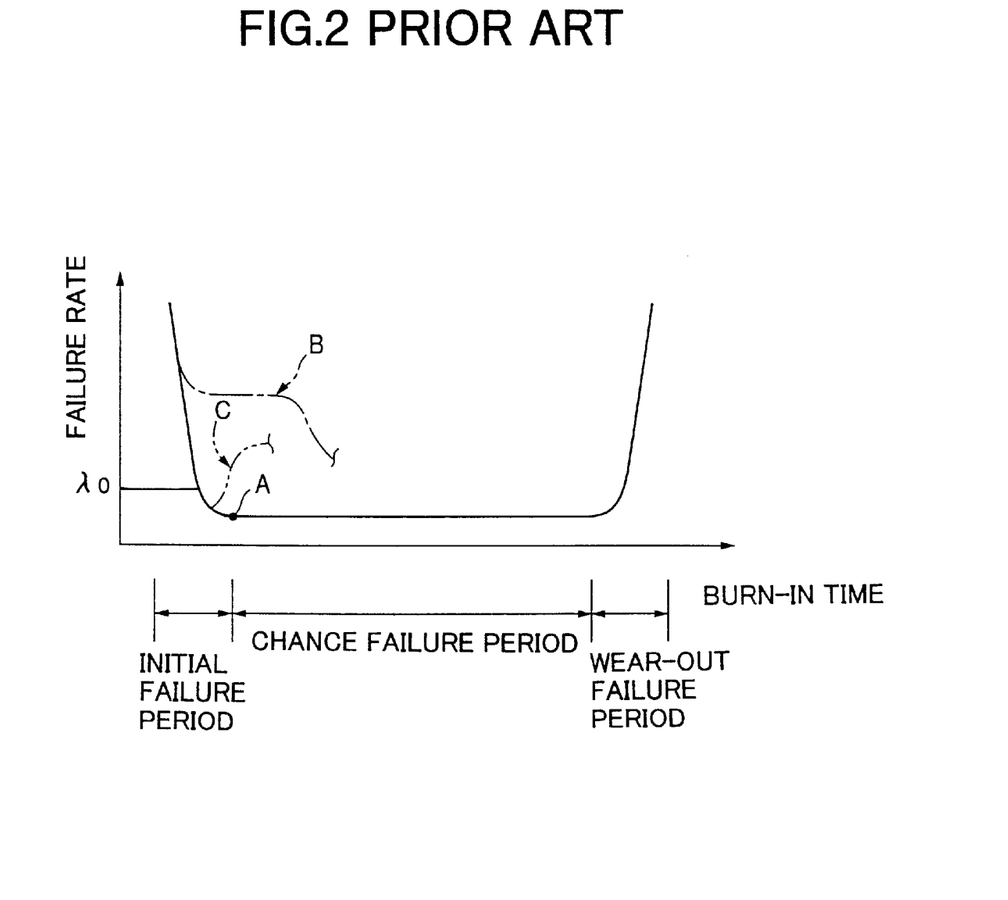
FIG. 2 shows the relationship between a burn-in period and a failure rate of semiconductor device.

FIG. 2 is a graph showing the relationship between a burn-in time (abscissa axis) and a failure rate (ordinate axis) in a burn-in test performed on semiconductor devices. This graph is generally known as a bath-tub curve. As can be seen from the graph, the failure rate caused by the burn-in test is high at the beginning and decreases with time (an initial failure period). The failure rate then reaches a value $\lambda_0$ and stays in the vicinity of the value (a chance failure period). As the burn-in test continues, the failure rate rapidly increases at one point (wear-out failure period). According to the bath-tub curve, the point where the burn-in test moves on to the chance failure period from the initial failure period can be considered the beginning of a stable period. Accordingly, it is ideal to end the burn-in test at the beginning of the stabilized period.

In view of this, the counter unit 6 outputs the burn-in termination instruction based on two parameters, a shape parameter (m) and the failure rate ($\lambda(t)$). The shape parameter (m) and the failure rate ($\lambda(t)$) are calculated based on quality data and parameters supplied from the monitor unit 4 using a Weibull function. When the shape parameter(m) and the failure rate ($\lambda(t)$) both become smaller than respective predetermined reference values, the burn-in test is stopped. When the shape parameter (m) and the failure rate ($\lambda(t)$) are both equal to or larger than the respective predetermined reference values, the burn-in test continues automatically.

Normally, a Weibull function is expressed as:

$$F(t)=1-\exp[-(t/\eta)m](t>0, \eta>0) \quad (1)$$

wherein $\eta$ is a scale parameter. According to the Weibull function, the failure rate function is expressed as:

$$\lambda(t)=(m \times tm-1)/\eta m \quad (2)$$

Using an acceleration factor $\beta$, the failure rate function is also expressed as:

$$\eta(t)=(m \times tm-1)/(\eta m \times \lambda) \times 10E9) \quad (3)$$

Here, the shape parameter (m) is determined from the inclination of an approximate line of a failure occurrence point plotted on a Weibull probability paper. When the shape parameter (m) is smaller than 1, the failure rate is decreasing. When the shape parameter (m) is equal to or larger than 1, the failure rate is increasing. The acceleration factor $\beta$ is a coefficient for comparing the acceleration in the "lifetime", and varies between semiconductor devices.

The burn-in termination instruction is issued when the shape parameter (m) is smaller than a predetermined reference value ($m_0$) and the failure rate ($\lambda(t)$) is smaller than a predetermined reference value ($\lambda_0$). The timing of the issuance of the burn-in termination instruction is determined based on both the shape parameter (m) and the failure rate ($\lambda(t)$), for the following reasons.

If the timing of the instruction issuance is determined from either the shape parameter (m) or the failure rate ($\lambda(t)$) alone, in one case the burn-in termination instruction is issued when the shape parameter (m) is 0 and the failure rate is larger than the predetermined reference value ($\lambda_0$), as indicated by an arrow B in FIG. 2. In another case, the burn-in termination instruction is issued when the shape parameter (m) is larger than 0 and the failure rate is smaller than the predetermined reference value ($\lambda_0$), as indicated by an arrow C in FIG. 2. The arrows B and C indicate situations where the failure rate has not decreased (i.e., the initial failure period has not ended). If the burn-in termination instruction is issued at such times as indicated by these above cases, the accuracy and reliability of the burn-in test is reduced.

Furthermore, there is a limit to the number of semiconductor devices accommodated in one burn-in system (mounting capacity number). However, a large number of semiconductor devices are manufactured at once to improve the production efficiency. The semiconductor devices collectively manufactured need to be subjected the burn-in test at the same time. Therefore, when the number of semiconductor devices to be subjected to the burn-in test is larger than the mounting capacity number, the semiconductor devices are mounted to a plurality of burn-in systems. Each of the burn-in systems performs the burn-in test to provide Weibull judgements.

In a case where the mounting capacity for one burn-in board is 216 and one burn-in system can accommodate 48 burn-in boards, for instance, the parameter, or maximum capacity, is 10,368. If the number of semiconductor devices is larger than the parameter, or maximum capacity, a plurality of burn-in systems perform the burn-in test independently of each other, each independently stopping the burn-in test when a result calculated in accordance the Weibull function is smaller than a predetermined reference value.

By this conventional method, however, the timing of the termination of the burn-in test is different between the burn-in systems. The timing variation is due to the difference in number of semiconductor devices, and to the difference in failure rate between the burn-in systems.

In a case where one of the burn-in systems has completed the burn-in test, the semiconductor devices can be removed from the burn-in system. However, it is necessary to wait for the other burn-in system(s) to finish the burn-in test, because the semiconductor devices collectively manufactured need to be processed in the next production procedure. This adversely affects the efficiency of the entire production procedures including the reliability test.

As mentioned before, to calculate the failure rate using the Weibull function, it is necessary to determine the parameter, which is the total number of semiconductor devices subjected to the burn-in test. However, in the conventional method, the parameter is limited to the mounting capacity number of one burn-in system, and the failure rate of all the semiconductor devices collectively manufactured cannot be calculated using the Weibull function and the total number of the semiconductor devices as the parameter.

This causes an inconvenient situation where the failure rate in one burn-in system is very high while the failure rate in another burn-in system is very low. As the failure rate differs between the burn-in systems, it is impossible to determine an accurate failure rate of all the semiconductor devices collectively manufactured.

SUMMARY OF THE INVENTION

A general object of the present invention is to provide burn-in systems and burn-in control techniques in which the above disadvantages are eliminated.

A more specific object of the present invention is to provide a burn-in system and a burn-in control technique by which a burn-in test can be efficiently and accurately performed on a large number of semiconductor devices. Another specific object of the present invention is to provide a semiconductor device production method utilizing the burn-in system and the burn-in control technique.

The above objects of the present inventions are achieved by a burn-in system comprising:

a plurality of burn-in devices, each of which calculates a parameter indicating the number of mounted semiconductor devices, and generates measurement data indicating quality of the semiconductor devices collectively subjected to a burn-in test; and a counter terminal which determines a total parameter from the parameters sent from each of the burn-in devices, calculates a failure rate based on the total parameter and measurement data also sent from each of the burn-in devices, and stops the burn-in test of the burn-in devices when the failure rate reaches a predetermined reference value.

The above objects of the present invention are also achieved by a burn-in control technique including the steps of:

mounting a plurality of semiconductor devices in each of the burn-in devices;

determining a parameter that is the number of semiconductor devices mounted in each of the burn-in devices;

generating measurement data indicating quality of the semiconductor devices by subjecting the mounted semiconductor devices to a burn-in test;

transmitting the parameter and the measurement data obtained from each of the burn-in devices to a counter terminal;

calculating a total parameter from the parameters sent from each of the burn-in devices;

calculating a failure rate based on the total parameter and the measurement data; and terminating the burn-in test of each of the burn-in devices when the failure rate reaches a predetermined reference value.

Since the above burn-in system has a plurality of burn-in devices, each of which can perform a burn-in test, semiconductor devices beyond the capacity of one burn-in device can be mounted to the plurality of burn-in devices and subjected to the burn-in test. Each of the burn-in devices performs the burn-in test collectively on a plurality of semiconductor devices to obtain the quality data of each of them. Here, the number of semiconductor devices mounted to each burn-in device can be obtained as a parameter.

The counter terminal receives the parameter and measurement data from each of the burn-in devices, and determines the total parameter by adding up the parameters sent from the burn-in devices. Since the counter device is independent of the burn-in devices, it can determine the total number of semiconductor devices mounted to the burn-in devices. The counter unit also calculates the failure rate based on the total parameter and the measurement data sent from the burn-in devices. As the calculated failure rate varies with the total parameter, it represents the failure rate of all the semiconductor devices mounted to the burn-in devices.

The counter terminal also stops the burn-in test when the failure rate reaches a predetermined reference value. Since the failure rate obtained as above has a high accuracy, the burn-in test can be stopped at the proper time. Also, the counter terminal can stop all the burn-in devices at once, because the burn-in test is terminated based on the failure rate of all the semiconductor devices mounted to the burn-in devices. Thus, the burn-in test can be performed at higher efficiency.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 3:
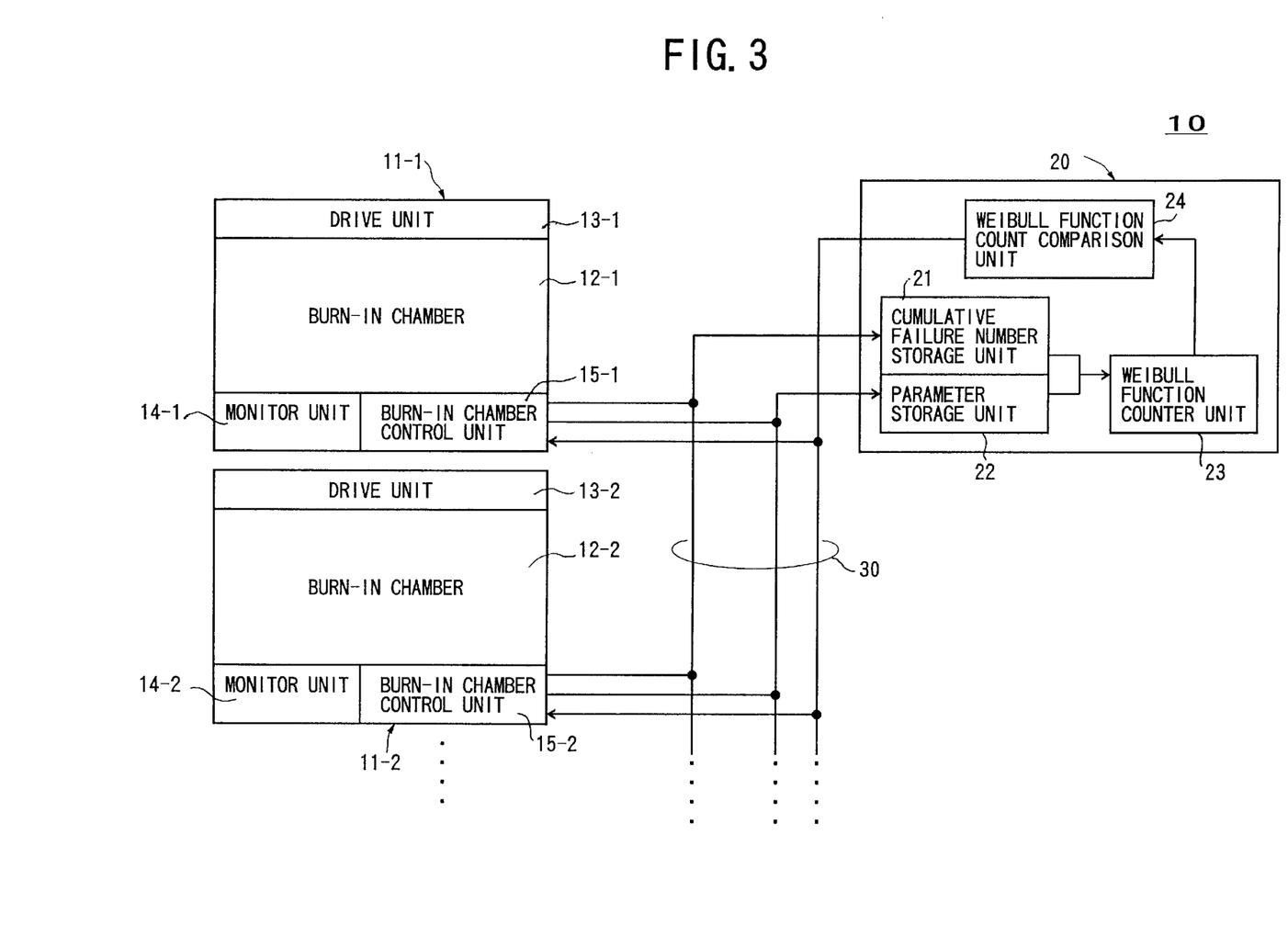
FIG. 3 shows the structure of a burn-in system of the present invention.

A burn-in system 10 shown in FIG. 3 comprises a plurality of burn-in devices 11-1 to 11-n and one counter terminal 20. The burn-in devices 11-1 to 11-n are connected to the counter terminal 20 by a communication cable 30. It should be understood here that only the burn-in devices 11-1 and 11-2 are shown in FIG. 3.

The burn-in devices 11-1 and 11-2 shown in FIG. 3 comprise burn-in chambers 12-1 and 12-2, drive units 13-1 and 13-2, monitor units 14-1 and 14-2, and burn-in chamber control units 15-1 and 15-2, respectively. The burn-in devices 11-1 and 11-2 of this embodiment are not provided with a counter unit equivalent to the counter unit 6 of the burn-in system 1 of the prior art shown in FIG. 1. Accordingly, each of the burn-in devices 11-1 to 11-n is simpler than the burn-in device 1 of the prior art.

The burn-in chambers 12-1 and 12-2 adjust the inner temperatures to the desired temperature, and accommodate burn-in boards to which semiconductor devices are mounted. A burn-in test is collectively carried out on the mounted semiconductor devices in the burn-in chambers 12-1 and 12-2.

The drive units 13-1 and 13-2 are respectively connected to each of the burn-in boards in the burn-in chambers 12-1 and 12-2, and supply operating current and operating signals to each semiconductor device via each corresponding burn-in board. The monitor units 14-1 and 14-2 monitor the operations of the semiconductor devices driven by the drive units 13-1 and 13-2, and supply the monitor results to the burn-in chamber control units 15-1 and 15-2.

The burn-in chamber control units 15-1 and 15-2 control the inner temperatures of the burn-in chambers 12-1 and 12-2 at a predetermined constant temperature, and also stop the burn-in test upon receipt of a burn-in termination instruction from the counter terminal 20. The burn-in chamber control units 15-1 and 15-2 have communication functions, and are connected to the counter terminal 20 by the communication cable 30.

The counter terminal 20 comprises a cumulative failure number storage unit 21, a parameter storage unit 22, a Weibull function counter unit 23, and a Weibull function count comparison unit 24.

The cumulative failure number storage unit 21 calculates the total number of semiconductor devices in which failures have occurred in the burn-in devices 11-1 and 11-2, based on quality data supplied from the burn-in devices 11-1 and 11-2 after each predetermined burn-in period of time. The cumulative failure number storage unit 21 then stores the calculated number.

For each of the burn-in devices 11-1 and 11-2, a parameter is determined in a process carried out prior to the burn-in test (see steps 14A-1 to 14A-n and 14B in FIG. 4), and the determined parameter is sent to the counter terminal 20. The parameter storage unit 22 adds up the parameters sent from the burn-in devices 11-1 and 11-2 to obtain the total number of semiconductor devices mounted to all the burn-in devices 11-1 and 11-2 (the total parameter). The parameter storage unit 22 then stores the total parameter. Here, the total parameter is the number of semiconductor devices which operate properly among all the semiconductor devices mounted in the burn-in chambers 12-1 and 122 when subjected to a simple preliminary test.

The Weibull function counter unit 23 calculates a shape parameter (m) and a failure rate ($\lambda(t)$) from the cumulative failure number successively supplied from the cumulative failure number storage unit 21 and the total parameter supplied from the parameter storage unit 22, using a Weibull function (see the formulas (1) to (3)).

The Weibull function count comparison unit 24 constantly compares the shape parameter (m) and the failure rate ($\lambda(t)$) calculated by the Weibull function counter unit 23 with reference values $m_0$ and $\lambda_0$, and transmits a burn-in termination instruction to each of the burn-in devices 11-1 and 11-2 when the shape parameter (m) and the failure rate ($\lambda(t)$) both become smaller than the reference values $m_0$ and $\lambda_0$.

Figure 4:
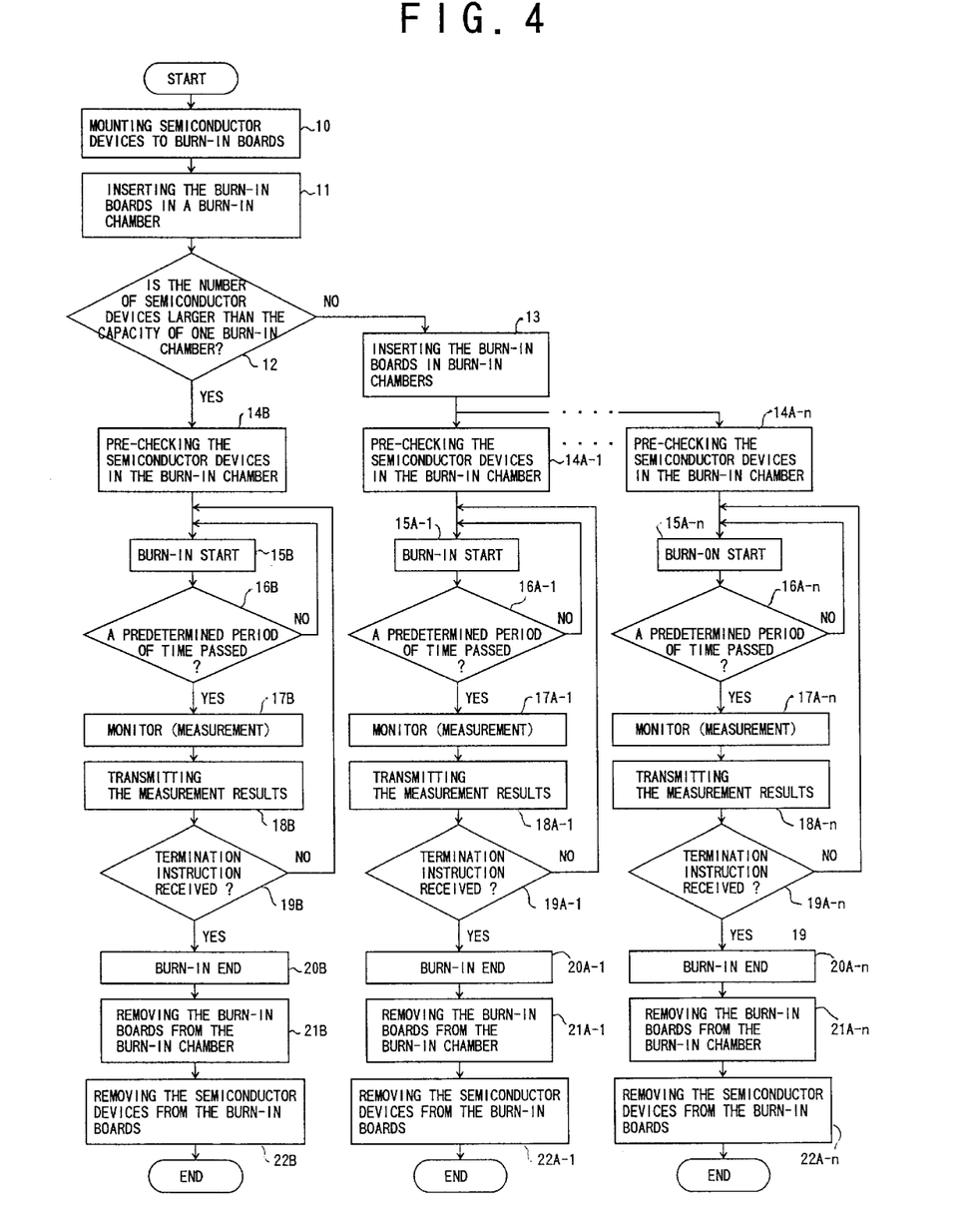
FIG. 4 is a flowchart of a burn-in control process carried out in an individual burn-in device of the present invention.
Figure 5:
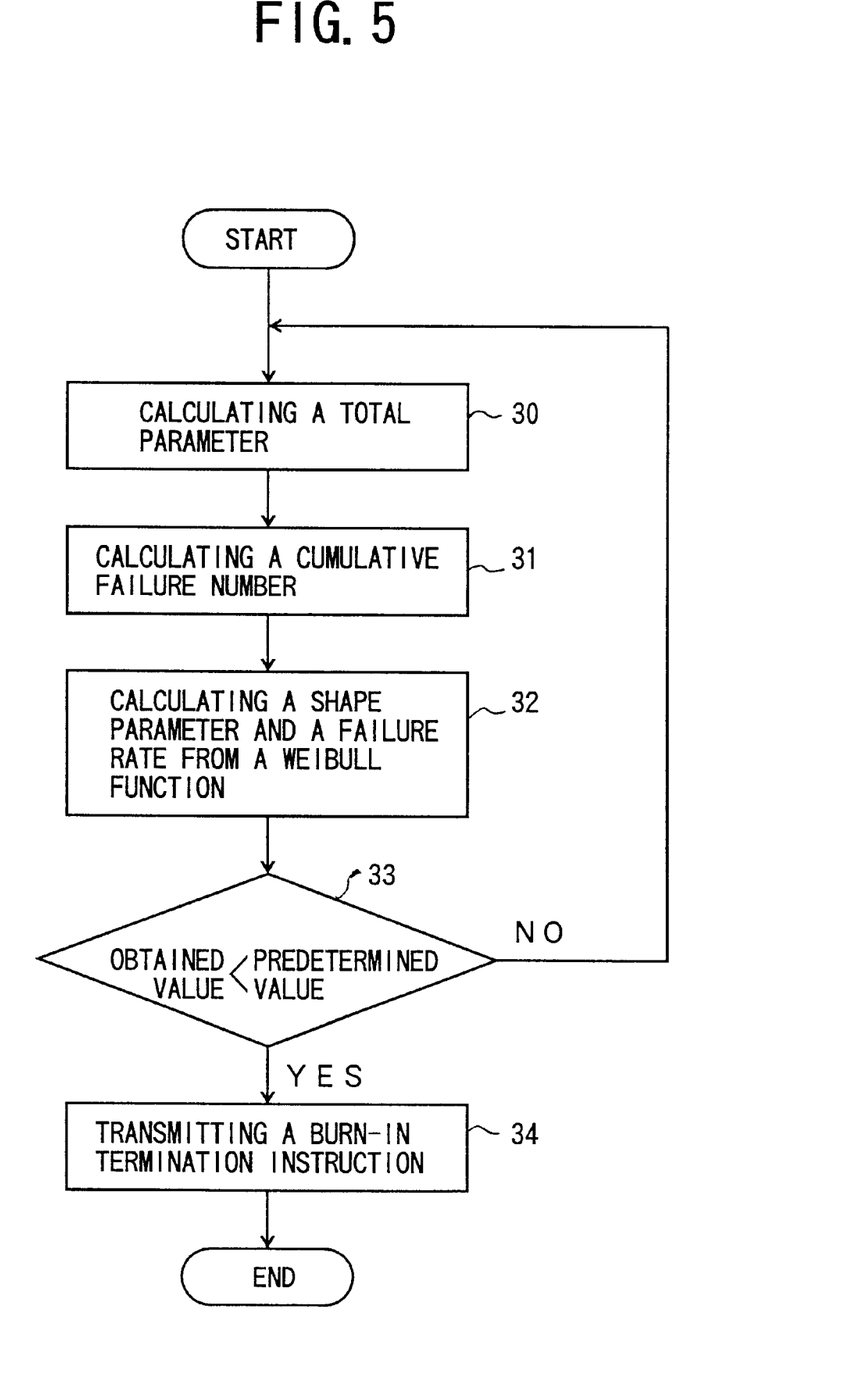
FIG. 5 is a flowchart of a burn-in control process carried out in a counter terminal.

Now referring to FIGS. 4 and 5, the operations of the burn-in devices 11-1 to 11-n and the counter terminal 20. FIG. 4 is a flowchart of processes carried out by the burn-in devices 11-1 to 11-n, and FIG. 5 is a flowchart of processes carried out by the counter terminal 20.

Steps 14 to 22 in FIG. 4 are common to the burn-in devices 11-1 to 11-n. The processes shown in FIG. 4 are divided into two cases. One is a case where the total parameter (the total number of semiconductor devices to be subjected to a burn-in test) is equal to or smaller than a mountable number (the number of semiconductor devices mountable in each of burn-inn devices 11-1 to 11-n). The other is a case where the total parameter is larger than the individual mountable range. Accordingly, in the case where the total parameter is equal to or smaller than the individual mountable number, i.e., where a burn-in test can be carried out with only one burn-in device 11-1, all the steps are denoted by reference numerals suffixed with "B". In the case where the total parameter is larger than the individual mountable range, i.e., where the burn-in devices 11-1 to 11-n are used in a burn-in test, all the steps are denoted by reference numerals suffixed with "A". Also, to identify which processes are carried out by which burn-in device in the latter case, the reference numerals denoting the steps are provided with "−1" to "−n" after "A".

To perform a burn-in test on semiconductor devices, the semiconductor devices are mounted to burn-in boards in a step 10. More specifically, each of the burn-in boards is provided with a plurality of sockets, and the semiconductor devices are mounted to the sockets. In a step 11, the burn-in boards, to which the semiconductor devices are mounted, are inserted in the burn-in chambers 12-1 to 12-n of the burn-in devices 11-1 to 11-n. In a step 12, it is judged whether all the burn-in boards can be mounted to the burn-in device 11-1. In other words, it is judged whether the total number of the semiconductor devices is within an individual mountable number.

If it is judged in the step 12 that not all the burn-in boards are mountable in the burn-in device 11-1, the operation moves on to a step 12 in which the remaining burn-in boards are inserted into the burn-in devices 11-2 to 11-n. Thus, all the semiconductor devices are mounted in the burn-in devices 11-1 to 11-n.

After the step 13, steps 14A-1 to 22A-1 (and steps 14A-n to 22A-n) are repeated for each of the burn-in devices 11-1 to 11-n. Since the same process is performed in the steps having the same reference numerals (for instance, the same process is carried out in the steps 14B and 14A-1 to 14A-n), the following description concerns only to the processes performed in the burn-in device 11-1.

In a step 14A-1, a simple preliminary test is performed to check how tight the semiconductor devices are fixed to the burn-in boards. The number of semiconductor devices that work properly in this preliminary test is used as the parameter. The test result is sent to the burn-in chamber control unit 15-1 and the parameter storage unit 22 of the counter unit 20 via the communication cable 30.

Next in a step 15A-1, the drive unit 12-1 operates to supply an input signal and a required voltage to each of the semiconductor devices via the burn-in boards, thereby starting the burn-in test. In a step 16A-1, the burn-in test is performed for a predetermined period of time. In a step 17A-1, the monitor unit 14-1 starts monitoring the semiconductor devices. The monitor unit 14-1 monitors the operation of each of the semiconductor devices, and supplies the burn-in chamber control unit 15-1 with measurement data including failure occurrence times and quality information. Also, the burn-in chamber control unit 15-1, which performs a communication function, transfers the measurement data to the cumulative failure number storage unit 21 of the counter unit 20 via the communication cable 30 in a step 18A-1.

In a step 19A-1, it is determined whether the counter unit 20 has transmitted a burn-in termination instruction. If not, the operation returns to the step 15A-1, and the steps 15A-1 to 19A-1 are repeated until the burn-in termination instruction is issued from the counter unit 20. The process of the counter unit 20 generating the burn-in termination instruction is shown in FIG. 5, and will be described later.

If it is determined in the step 19A-1 that the counter unit 20 has issued the burn-in termination instruction, the burn-in chamber control unit 15-1 controls the drive unit 13-1 to stop the power supply and. input signal supply to the semiconductor devices, thereby terminating the burn-in test in a step 20A-1. The burn-in boards are removed from the burn-in chamber 12-1 in a step 21-A1. The semiconductor devices are removed from the burn-in boards in a step 22A-1.

Meanwhile, in the case where all the burn-in boards can be mounted to the burn-in device 11-1, only the burn-in device 11-1 performs the burn-in test, and steps 14B to 22B are carried out. The steps 14B to 22B are the same as the steps 14A-1 to 22A-1.

Referring now to FIG. 5, the process of the counter unit 2- generating the burn-in termination instruction will be described.

A step 30 is carried out by the parameter storage unit 22. As mentioned before, the parameter of each of the burn-in devices 11-1 to 11-n is determined in the preliminary test of the steps 14A-1 to 14A-n or the step 14B, and is sent to the parameter storage unit 22. In the step 30, the parameter storage unit 22 adds up the parameters sent from the burn-in devices 11-1 to 11-n to obtain and store the total parameter.

A step 31 is carried out by the cumulative failure number storage unit 21. As mentioned before, the measurement data obtained in the steps 18A-1 to 18A-n or the step 18B is sent to the cumulative failure number storage unit 21. In the step 31, the cumulative failure number storage unit 21 collectively processes the measurement data sent from the burn-in devices 11-1 to 11-n to calculate a cumulative failure number which is the number of failed semiconductor devices in the entire burn-in system 10. The cumulative failure number storage unit 21 also stores the cumulative failure number at certain intervals.

A step 32 is carried out by the Weibull function counter unit 23. The Weibull function counter unit 23 uses the cumulative failure number obtained by the cumulative failure number storage unit 21 and the total parameter obtained by the parameter storage unit 22 to determine the shape parameter (m) and the failure rate ($\lambda(t)$) in accordance with the Weibull function (see the formulas (1) to (3)). The shape parameter (m) and the failure rate ($\lambda(t)$) are sent to the Weibull function count comparison unit 24.

Steps 33 and 34 are carried out by the Weibull function count unit 24. The Weibull function count unit 24 constantly compares the shape parameter (m) and the failure rate ($\lambda(t)$) with the respective reference values $m_0$ and $\lambda_0$ in the step 33. When the shape parameter (m) and the failure rate ($\lambda(t)$) both become smaller than the respective reference values $m_0$ and $\lambda_0$ ($m<m_0$ and $\lambda(t)<\lambda_0$), the Weibull function count comparison unit 24 sends the burn-in termination instruction to the burn-in devices 11-1 to 11-n in the step 34. Upon receipt of the burn-in termination instruction from the counter unit 20, the burn-in devices 11-1 to 11-n terminate the burn-in test.

As described above, the burn-in termination instruction is issued only when the shape parameter (m) and the failure rate ($\lambda(t)$) both become smaller than the respective reference values $m_0$ and $\lambda_0$. By doing so, the issuance of the burn-in termination can be more accurate in timing, compared to a situation in which the burn-in instruction is issued based only on the failure rate ($\lambda(t)$). In this embodiment, the counter terminal 20, which is independent of the burn-in devices 11-1 to 11-n, collectively calculates the total parameter and the cumulative failure number based on the parameters and measurement data sent from the burn-in devices 11-1 to 11-n. The counter terminal further calculates the shape parameter (m) and the failure rate ($\lambda(t)$) based on the total parameter and the cumulative failure number. Accordingly, the obtained shape parameter (m) and the failure rate ($\lambda(t)$) accurately reflect the quality of all the semiconductor devices mounted in the burn-in devices 11-1 to 11-n.

Since the issuance of the burn-in termination instruction is decided based on the shape parameter (m) and the failure rate ($\lambda(t)$) both having a high accuracy, the burn-in termination instruction can be issued to the burn-in devices 11-1 to 11-n at the proper time. Thus, the burn-in test can be stopped before the chance failure period and the wear-out failure period (see FIG. 2), and chance failures and wear-out failures can be prevented.

The counter terminal 20 also stops the burn-in test based on the failure rate of all the semiconductor devices mounted to the burn-in devices 11-1 to 11-n, so that the burn-in termination instruction is issued simultaneously to all the burn-in devices 11-1 to 11-n. Accordingly, a conventional problem in which the burn-in test still continues in some burn-in devices while the burn-in test has finished in the other burn-in devices can be prevented. Thus, according to the present invention, the burn-in test can be performed more efficiently.

The present invention is not limited to the specifically disclosed embodiments, but variations and modifications may be made without departing from the scope of the present invention.

The present application is based on Japanese priority application No. 11-200213, filed on Jul. 14, 1999, the entire contents of which are hereby incorporated by reference.

What is claimed is:

1. A burn-in system comprising:

a plurality of burn-in devices in which a plurality of semiconductor devices are mountable, each of the plurality of burn-in devices calculates a parameter indicating the number of mounted semiconductor devices in the burn-in device, and generates measurement data indicating failure of the mounted semiconductor devices collectively subjected to a burn-in test; and a counter terminal which determines a total parameter from the respective parameters sent from the plurality of burn-in devices, calculates a failure rate for the plurality of burn-in devices, by using a Weibull function, based on the total parameter and the respective measurement data sent from the plurality of burn-in devices, and stops the burn-in test of the plurality of burn-in devices when the failure rate reaches a predetermined reference value.

2. The burn-in system as claimed in claim 1, wherein the counter terminal comprises:

a parameter storage unit which calculates a total parameter indicating the total number of the semiconductor devices subjected to the burn-in test based on parameters sent from each of the burn-in devices, and stores the total parameter;

a cumulative failure number storage unit which calculates a cumulative failure number indicating a total number of semiconductor devices in which failures have occurred among all the semiconductor devices based on the measurement data sent from each of the burn-in devices, and stores the total failure number;

a Weibull function counter unit which calculates the failure rate and a shape parameter based on a Weibull function and information successively received from the cumulative failure number strong unit; and a Weibull function count comparison unit which compares the failure rate and the shape parameter calculated by the Weibull function counter with predetermined reference values, and sends a burn-in termination instruction to the burn-in devices when the failure rate and the shape parameter become smaller than the respective reference values.

3. The burn-in system as claimed in claim 1, wherein each of the burn-in devices comprises:

a burn-in chamber which carries out a heating process to collectively subject the semiconductor devices to the burn-in test;

a drive unit which supplies a driving signal to the semiconductor devices;

a monitor unit which monitors operating states of the semiconductor device driven by the drive unit; and a burn-in chamber control unit which controls operations of the burn-in chamber, the drive unit, and the monitor unit, the burn-in chamber control unit being provided with a transmission unit which transmits the parameter and the measurement data to the counter terminal.

4. A burn-in control method comprising the steps of:

mounting a plurality of semiconductor devices to each of a plurality of burn-in devices;

determining a parameter that is the number of semiconductor devices mounted to each of the plurality of burn-in devices;

generating measurement data indicating quality of the semiconductor devices by subjecting the mounted semiconductor devices to a burn-in test;

transmitting the parameter and the measurement data obtained from each of the burn-in devices to a counter terminal;

calculating a total parameter from the parameters sent from each of the burn-in devices;

calculating a failure rate based on the total parameter and the measurement data; and terminating the burn-in test of each of the burn-in devices when the failure rate reaches a predetermined reference value.

5. A semiconductor device production method utilizing a burn-in control technique which includes steps of:

mounting a plurality of semiconductor devices to each of a plurality of burn-in devices;

determining a parameter that is the number of semiconductor devices mounted to each of the plurality of burn-in devices which operate properly when subjected to a simple preliminary test;

generating measurement data indicating quality of the semiconductor devices by subjecting the mounted semiconductor devices to a burn-in test;

transmitting the parameter and the measurement data obtained from each of the burn-in devices to a counter terminal;

calculating a total parameter from the parameters sent from each of the burn-in devices;

calculating a failure rate based on the total parameter and the measurement data; and terminating the burn-in test of each of the burn-in devices when the failure rate reaches a predetermined reference value.

* * * * *